United States Patent
Park et al.

(10) Patent No.: US 12,243,770 B2
(45) Date of Patent: Mar. 4, 2025

(54) HARD MASK REMOVAL WITHOUT DAMAGING TOP EPITAXIAL LAYER

(71) Applicant: International Business Machines Corporation, Armonk, NY (US)

(72) Inventors: Chanro Park, Clifton Park, NY (US); Yann Mignot, Slingerlands, NY (US); Daniel J. Vincent, Madison, WI (US); Su Chen Fan, Cohoes, NY (US); Christopher J. Waskiewicz, Rexford, NY (US); Hsueh-Chung Chen, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 633 days.

(21) Appl. No.: 17/490,465

(22) Filed: Sep. 30, 2021

(65) Prior Publication Data

US 2023/0095956 A1     Mar. 30, 2023

(51) Int. Cl.

| | |
|---|---|
| *H01L 21/768* | (2006.01) |
| *H01L 21/02* | (2006.01) |
| *H01L 21/3105* | (2006.01) |
| *H01L 21/311* | (2006.01) |
| *H01L 21/3213* | (2006.01) |
| *H01L 29/78* | (2006.01) |

(52) U.S. Cl.
CPC .... *H01L 21/76814* (2013.01); *H01L 21/0228* (2013.01); *H01L 21/31053* (2013.01); *H01L 21/31144* (2013.01); *H01L 21/32134* (2013.01); *H01L 21/76834* (2013.01); *H01L 29/7827* (2013.01)

(58) Field of Classification Search
CPC ..... H01L 21/823814; H01L 21/823821; H01L 21/0924; H01L 21/76814; H01L 21/31053; H01L 21/31144; H01L 21/32134; H01L 21/76834; H01L 2221/1063; H01L 21/76831
See application file for complete search history.

(56) References Cited

U.S. PATENT DOCUMENTS

| | | |
|---|---|---|
| 6,521,542 B1 | 2/2003 | Armacost |
| 9,385,078 B1 | 7/2016 | Feurprier |
| 9,466,563 B2 | 10/2016 | Mignot |
| 10,229,986 B1 | 3/2019 | Jagannathan |
| 10,297,688 B2 | 5/2019 | Cheng |

(Continued)

OTHER PUBLICATIONS

Koike et al., "Self-forming diffusion barrier layer in Cu—Mn alloy metallization," Applied Physics Letters, vol. 87, No. 4, 2005. 3 pages.

*Primary Examiner* — Jesse Y Miyoshi
*Assistant Examiner* — Ricky Verdes
(74) *Attorney, Agent, or Firm* — Gavin Giraud

(57) ABSTRACT

Embodiments disclosed herein describe methods of forming semiconductor devices. The methods may include etching vias and trenches in a middle-of-line (MOL) layer that has a low-k dielectric layer, a sacrificial nitride layer, and a hard mask layer. The methods may also include depositing a thin nitride layer within the via trench, depositing a carbon layer on the thin nitride layer within the vias and trenches, etching back the thin nitride layer to expose a portion of the hard mask layer, removing the hard mask layer and the carbon layer, and removing the thin nitride layer and the sacrificial nitride layer.

20 Claims, 11 Drawing Sheets

(56) References Cited

U.S. PATENT DOCUMENTS

| | | |
|---|---|---|
| 10,566,251 B2 | 2/2020 | Lee |
| 10,692,776 B2 | 6/2020 | Miller |
| 2013/0344699 A1* | 12/2013 | Chiba ............... H01L 21/02274 438/700 |
| 2016/0379872 A1* | 12/2016 | Kamineni ......... H01L 21/32134 257/774 |

* cited by examiner

HARD MASK REMOVAL WITHOUT DAMAGING TOP EPITAXIAL LAYER

BACKGROUND

The present invention relates generally to the field of fabrication for semiconductor devices, and more particularly to removing a hard mask without damaging a top epitaxial layer.

In fabricating semiconductor devices, millions of devices can be located together on a single substrate. Useful control of these millions of devices relies on the application of electrical signals to specific devices while insulting the electrical signals from shorting to anything else (e.g., other devices). Etching is used in fabrication to remove layers from a wafer of these devices during manufacturing. Etching is a process that is used on every wafer before fabrication is complete.

For many etch steps, part of the wafer is protected from the etchant by a "masking" material which resists etching. In some cases, the masking material is a photoresist which has been patterned using photolithography. Other situations require a more durable mask, such as silicon nitride. Wet etching is the process of removing a material chemically with a liquid reactant. It may involve a chemical which dissolves the material to be etched, or may utilize a chemical mixture which first oxidizes the material and then dissolves the oxide. Wet etch is typically used to remove a top layer from a semiconductor wafer, without harming the structure underneath that film, or etch cavities into a wafer—parts of which are protected by a mask. Wafers are either immersed in a bath, or sprayed on, with chemistries depending on the film that requires removal.

SUMMARY

According to one embodiment of the present invention, a method is disclosed. The method includes etching vias and trenches in a middle-of-line (MOL) layer that has a low-k dielectric layer, a sacrificial nitride layer, and a hard mask layer. The method may also include depositing a thin nitride layer within the via trench, depositing a carbon layer on the thin nitride layer within the vias and trenches, etching back the thin nitride layer to expose a portion of the hard mask layer, removing the hard mask layer and the carbon layer, and removing the thin nitride layer and the sacrificial nitride layer.

According to one embodiment of the present invention, a method is disclosed. The method may include etching vias and trenches in a middle-of-line (MOL) layer. The vias and trenches may include a bottom horizontal portion of the vias and trenches, vertical portions, and a top horizontal portion of the vias and trenches. The method may also include depositing a thin nitride layer on the bottom horizontal portion of the vias and trenches, the vertical portions of the vias and trenches, and the top horizontal portion of the vias and trenches, depositing a carbon layer on the first horizontal portion of the vias and trenches, etching back the top horizontal portion of the thin nitride layer to expose a hard mask layer, removing the hard mask layer to expose a sacrificial nitride layer, removing the carbon layer, and removing the thin nitride layer and the sacrificial nitride layer.

According to one embodiment of the present invention, a method is disclosed. The method may include depositing a thin nitride layer within vias and trenches of a middle-of-line (MOL) layer, depositing a carbon layer on the thin nitride layer within the vias and trenches, etching back a top horizontal portion of the thin nitride layer to expose a hard mask layer, removing the hard mask layer and the carbon layer, and removing the thin nitride layer and a sacrificial nitride layer.

DETAILED DESCRIPTION

Figure 1:
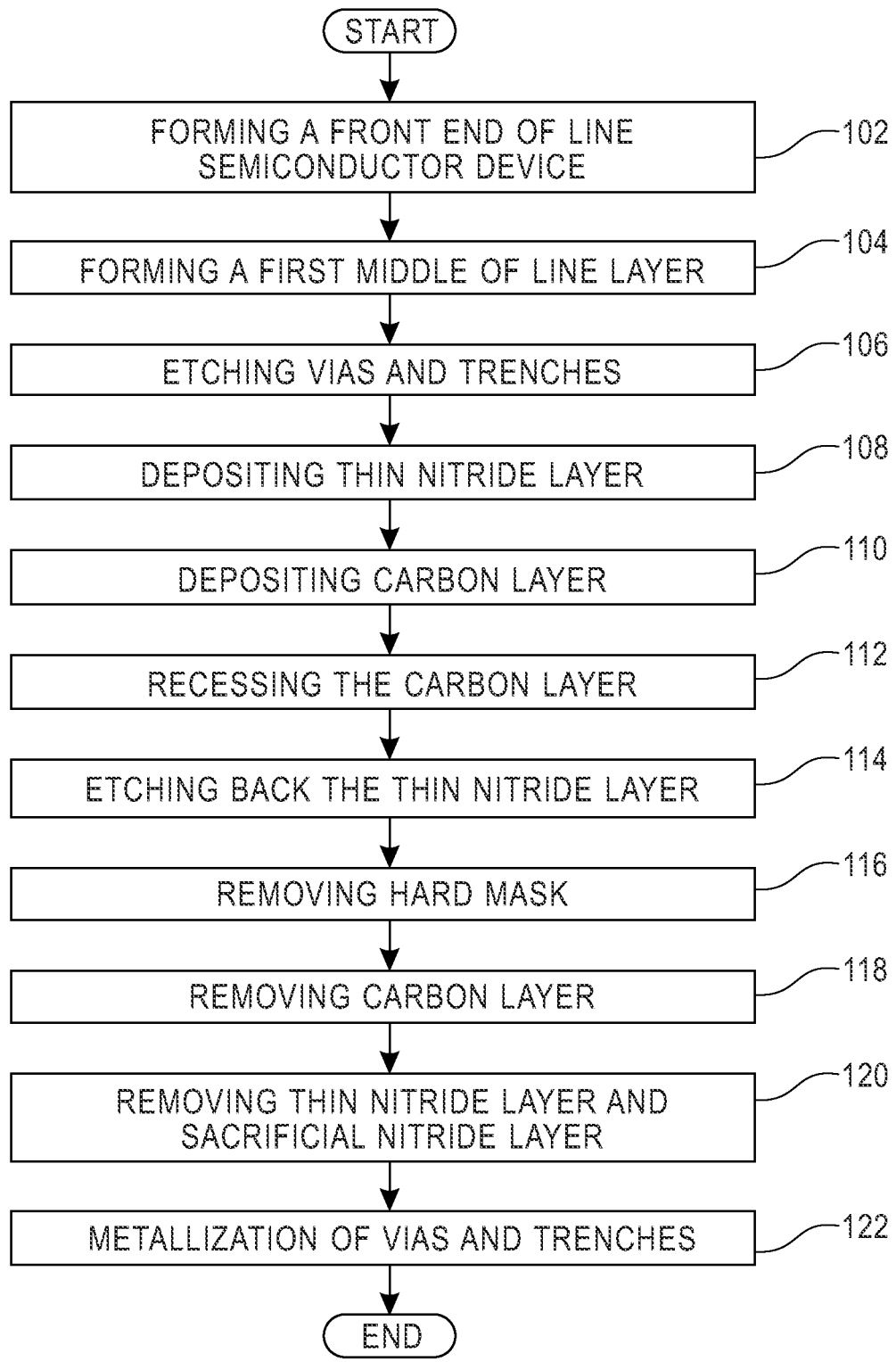
FIG. 1 depicts a flowchart of the steps of fabricating a semiconductor device, and subsequent structures, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized and that structural, logical and electrical changes may be made without departing from the described embodiments. The following detailed description is, therefore, not to be taken in a limiting sense, and the included embodiments are defined by the appended claims.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

With regard to the fabrication of transistors and integrated circuits, major surface refers to that surface of the semiconductor layer in and about which a plurality of transistors are fabricated, e.g., in a planar process. As used herein, the term "vertical" means substantially orthogonal with respect to the major surface and "horizontal" means substantially parallel to the major surface. Typically, the major surface is along a plane of a monocrystalline silicon layer on which transistor devices are fabricated.

For integrated circuits, the masking, patterning, and etching of device components makes possible the fabrication of semiconductor devices at the micro and nano scale. As devices, components, and layers continually decrease in size and pitch, however, the etching techniques that have been used in the past can cause unintended consequences. As a specific example, wet etch removal of hard mask layers for vertical field-effect transistors (VTFET) can also remove portions of the P-Epi such that the metallization step may not fully contact the top P-Epi source/drain. Furthermore, dielectric materials (e.g., a low-k material on a border between a semiconductor device and a first middle-of-line layer) can also be unintentionally etched such that a component intended to be a low-k dielectric is etched and becomes a high-k dielectric, or vice versa.

The devices and methods disclosed below address the problem of P-Epi attack and dielectric lateral etch by including a sacrificial nitride deposition step within the process, which is removed before fabrication is complete.

Turning now to the figures, FIG. 1 depicts a flowchart of the steps of fabricating a semiconductor device, and subsequent structures, in accordance with one embodiment of the present invention. Fabricating starts with forming a front-end-of-line (FEOL) semiconductor device (block 102). The FEOL semiconductor device may include devices of a variety of types and functions. For example, the method of FIG. 1 may include steps taken during fabrication of a vertical field-effect transistor (VTFET) as illustrated in FIG. 2.

Figure 2:
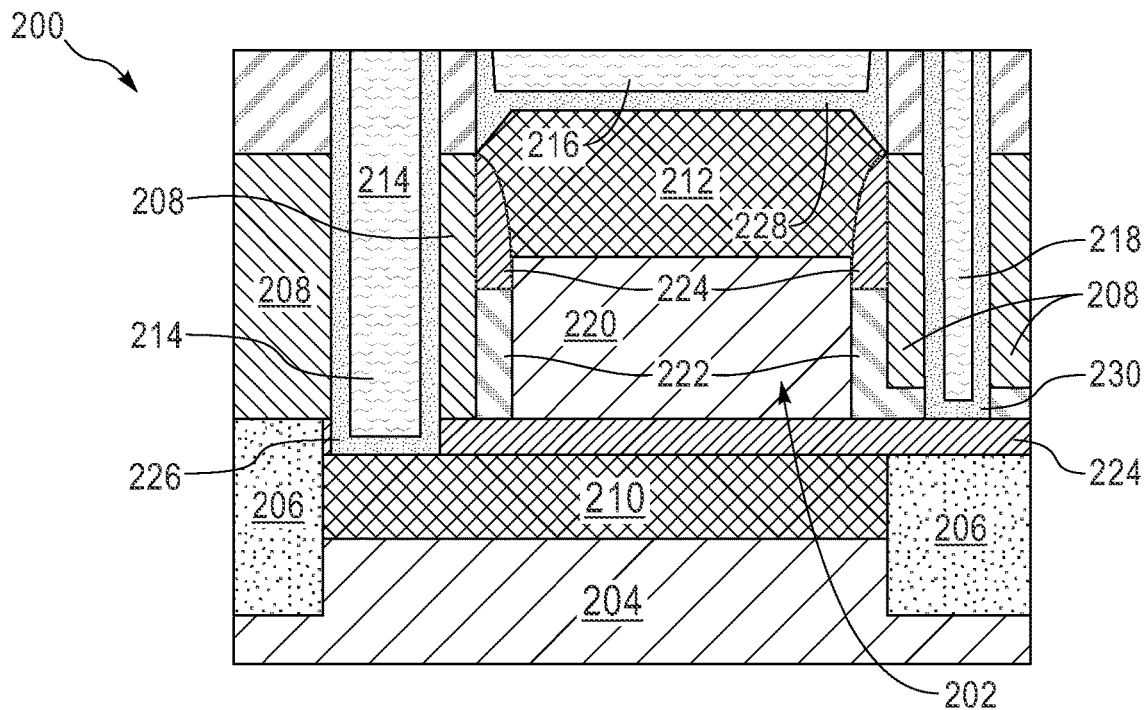
FIG. 2 is a schematic cross-sectional side view depicting a VTFET device, in accordance with one embodiment of the present invention.

FIG. 2 is a schematic cross-sectional side view depicting a FEOL semiconductor device 202 of a VTFET device 200, in accordance with one embodiment of the present invention. The FEOL semiconductor device 202 is fabricated on a substrate 204 and isolated by a shallow trench isolation structures (STI) 206 and inter-layer dielectrics (ILD) 208. Forming the FEOL semiconductor device 202 includes forming a bottom source/drain (S/D) 210 and a top S/D 212. The S/Ds 210, 212 may be formed by epitaxially growth, and may include P-Epi or N-Epi types of epitaxial layers. The bottom S/D 210 electrically contacts a bottom S/D contact 214, while the top S/D contact a top S/D contact 216. The FEOL semiconductor device 202 also includes a gate contact 218 landing on gate 222 which is formed around vertical channel 220. Biasing the gate 222 controls an electron flow through the FEOL semiconductor device 202 between the bottom S/D 210 and the top S/D 212. The FEOL semiconductor device 202 may also include spacers 224 that insulate components of the FEOL semiconductor device 202 to prevent shorting between gate 222 and bottom S/D 210. The contacts 214, 216, 218 may also include liners that ensure a strong electrical connection. Specifically, the bottom S/D contact 214 has a bottom contact liner 226, the top S/D contact 216 has a cap liner 228, and the gate contact 218 has a gate contact liner 230.

Figure 3:
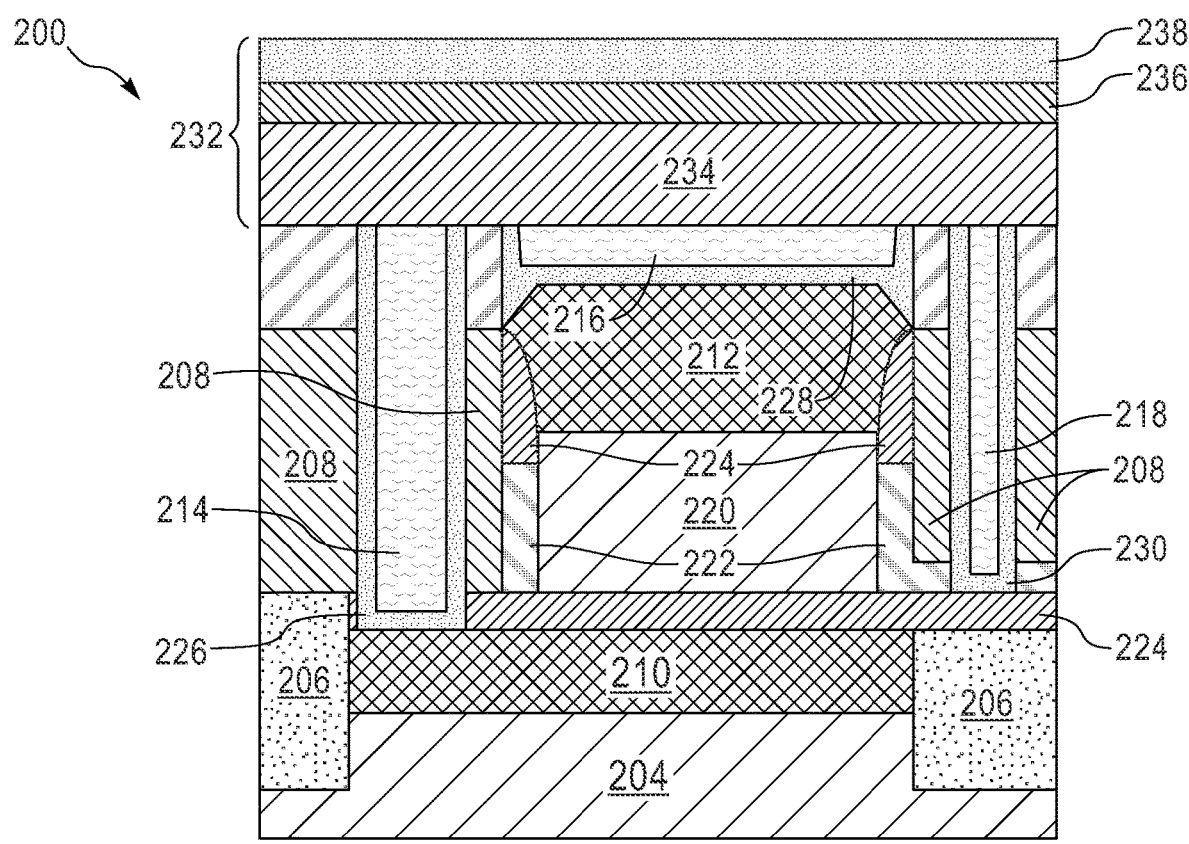
FIG. 3 is a schematic cross-sectional side view depicting a first middle-of-line (MOL) layer fabrication stage, in accordance with one embodiment of the present invention.

FIG. 3 is a schematic cross-sectional side view depicting the VTFET device 200 at a fabrication stage, in accordance with one embodiment of the present invention. The VTFET device 200 includes forming a first middle-of-line (MOL) layer 232 (block 104). The first MOL layer 232 includes three layers: a low-k dielectric layer 234, a sacrificial nitride layer 236, and a hard mask layer 238. The hard mask layer 238 may include, for example, titanium nitride. The sacrificial nitride layer 236 and the hard mask layer 238 are used only during the fabrication process, as explained below, while the low-k dielectric layer 234 will remain in the final VTFET device 200 (although in an altered state as also explained below).

Figure 4:
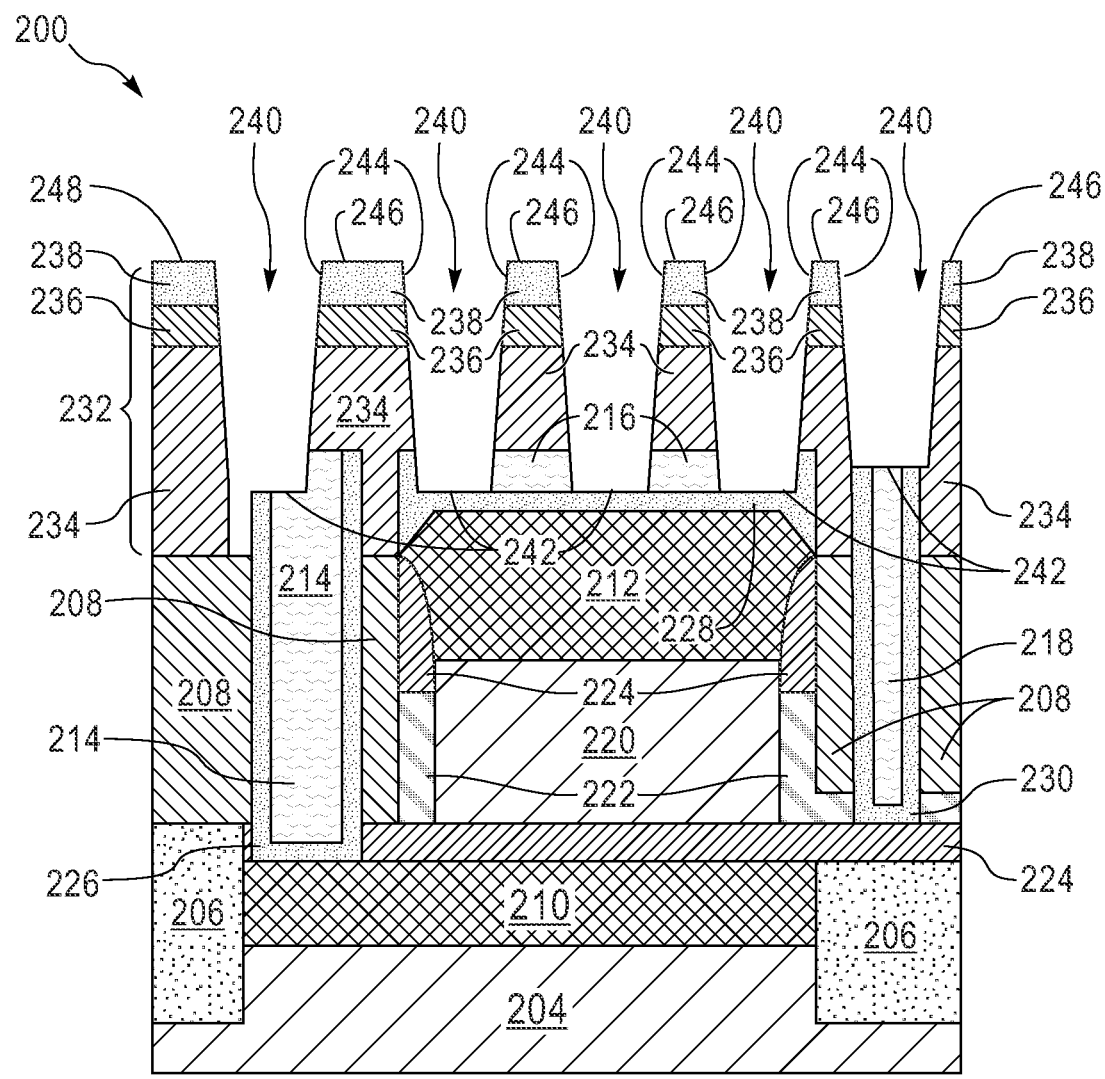
FIG. 4 is a schematic cross-sectional side view depicting a method at a first trench etch fabrication stage, in accordance with one embodiment of the present invention.

FIG. 4 is a schematic cross-sectional side view depicting the VTFET device 200 at a fabrication stage, in accordance with one embodiment of the present invention. The VTFET device 200 includes etching vias and trenches 240 (only trenches are visible in the cross-section, block 106). The hard mask layer 238 may be patterned (e.g., using lithography) so that the vias and trenches 240 may be subsequently formed through an etching process. In some embodiments, this etching can be performed using an anisotropic etch such as reactive ion etching (RIE). The hard mask layer 238 resists etching and can be utilized to form the desired shape of the vias and trenches 240. In the illustrated embodiment, the vias and trenches 240 are formed through the first MOL layer 232 such that each via and trench 240 includes a bottom horizontal portion 242 at a bottom of the via and trench 240, vertical portions 244 on the sides of the via trench 240, and a top horizontal portion 246 at a top of the via trench 240. The bottom horizontal portion 242, in certain embodiments, contacts the top S/D contact 216 while in certain embodiments (as illustrated) the bottom horizontal portion 242 contacts the cap liner 228. In embodiments where the via trench 240 is etched through the top S/D contact 216, and the bottom horizontal portion 242 contacts the cap liner 228, the etch processes for removing the hard mask layer 238 and the sacrificial nitride layer 236 can damage the cap liner 228, which may be formed from similar materials (e.g., nitride). The damage may also progress into the top S/D 212 and affect the metallization of vias within the via trenches 240. To protect against this damage to the cap liner 228 and top S/D 212, the VTFET device 200 may include additional nitride during fabrication.

Figure 5:
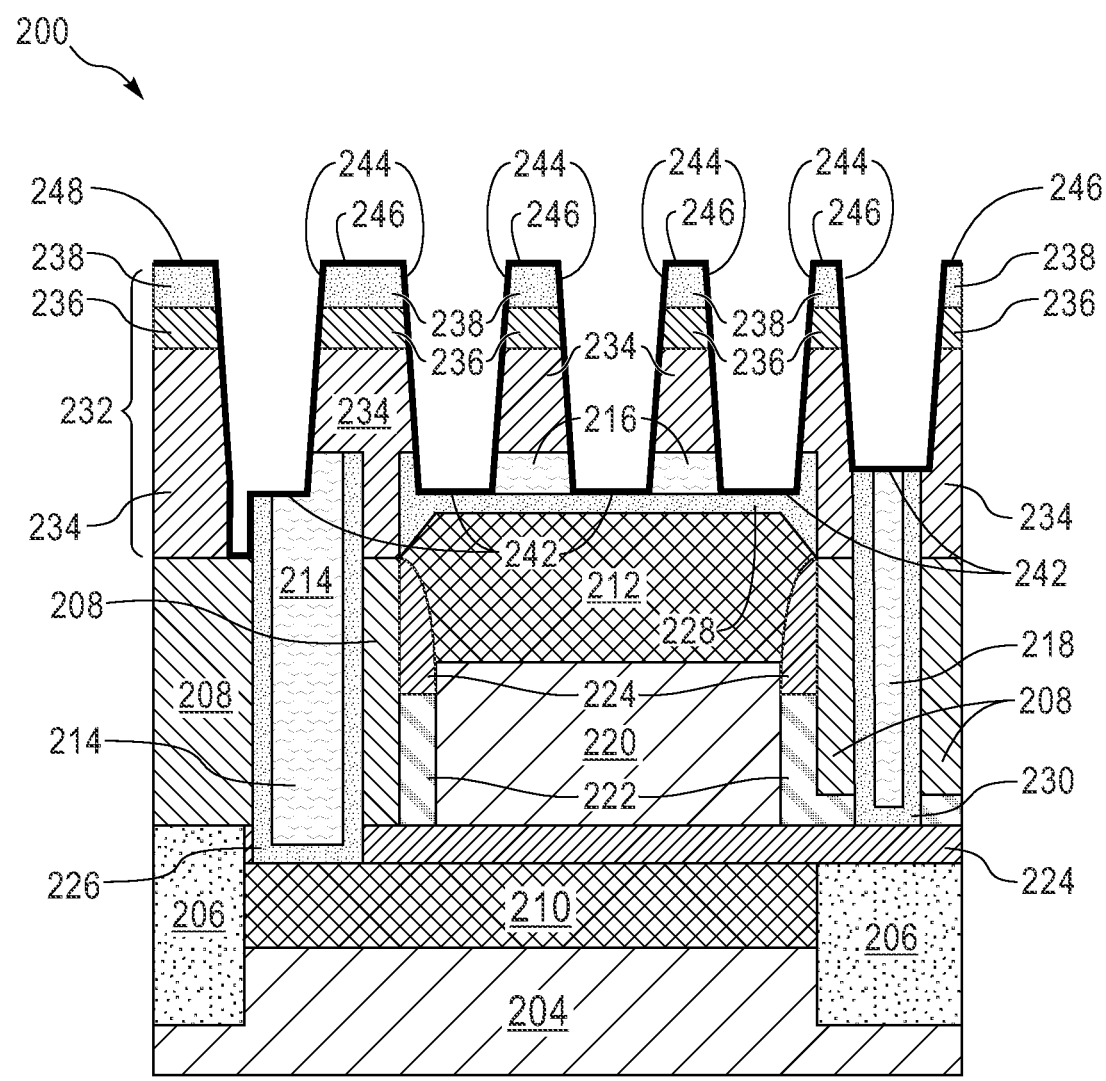
FIG. 5 is a schematic cross-sectional side view depicting a method at a sacrificial nitride deposition fabrication stage, in accordance with one embodiment of the present invention.

FIG. 5 is a schematic cross-sectional side view depicting the VTFET device 200 at a fabrication stage, in accordance with one embodiment of the present invention. The VTFET device 200 may include depositing a thin nitride layer 248 (block 108). The thin nitride layer 248 may be deposited as a blanket layer over all of the VTFET device 200. The deposition may utilize atomic layer deposition (ALD), such that the thin nitride layer 248 may form a uniform nano-scale layer over the bottom horizontal portion 242, the vertical portions 244, and the top horizontal portion 246. The thin nitride layer 248 may therefore contact the top S/D contact 216 and/or the cap liner 228, depending on where the bottom horizontal portion 242 of the via trench 240 is located.

Figure 6:
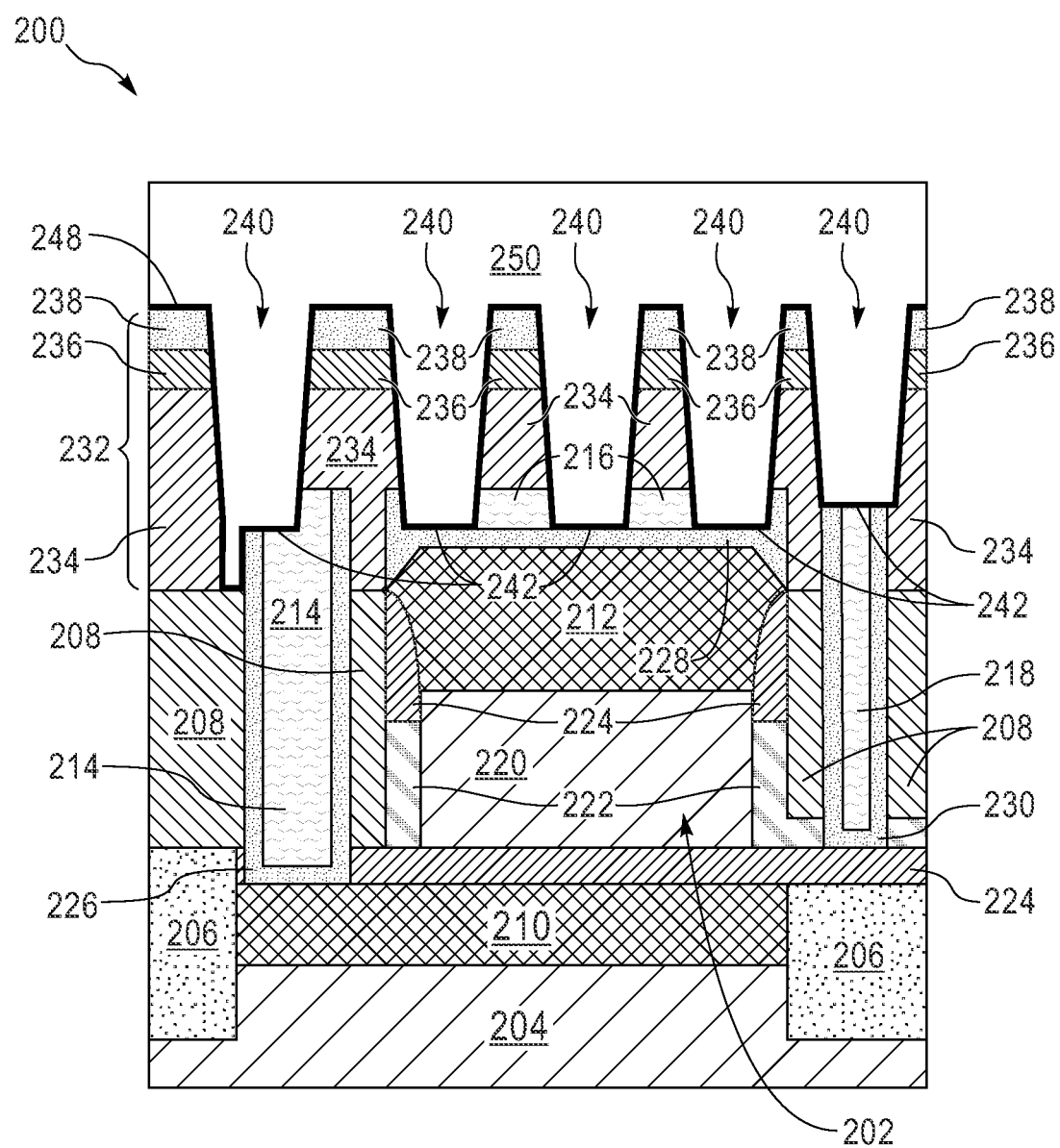
FIG. 6 is a schematic cross-sectional side view depicting a method at a spin-on carbon coating and planarization fabrication stage, in accordance with one embodiment of the present invention.

FIG. 6 is a schematic cross-sectional side view depicting the VTFET device 200 at fabrication stage, in accordance with one embodiment of the present invention. The VTFET device 200 may have a carbon layer 250 deposited within the via trenches 240 and over the VTFET device 200 (block 110). The carbon layer 250 may be deposited using a spin-on carbon technique that deposits the carbon layer 250 evenly. The carbon layer 250 may be part of a multilayer patterning scheme. In the multilayer stack, underlayer materials may be tuned to optimize gap fill within the vias and trenches 240, etch resistance during recess of the carbon layer 250, and planarization to enable high resolution and high aspect ratio patterning.

The carbon layer 250 can be applied by any known application method, with one preferred method being spin-coating the composition for a time period of a few seconds to a few minutes. After the composition is applied, it may be heated to evaporate solvents. The heating initiates a reaction to cure the carbon layer 250, which may also include a crosslinked acid. The carbon layer 250 may be formed at a thickness sufficient to substantially cover the via trenches 240 and the VTFET device 200 as a whole to achieve the above average thicknesses over the topography.

The dried carbon layer 250 will be substantially insoluble in typical organic solvents used to form subsequent layers in the multilayer stack. The film may be rinsed with a solvent (e.g., ethyl lactate), followed by spin drying to remove the solvent. The thickness is measured again at those five points on the wafer using ellipsometry, and the average of these measurements is determined. This is the average final film thickness. The carbon layer 250 may be planarized as part of the deposition process, such that the thickness above the top horizontal portion 246 of the VTFET device 200 is uniform.

Figure 7:
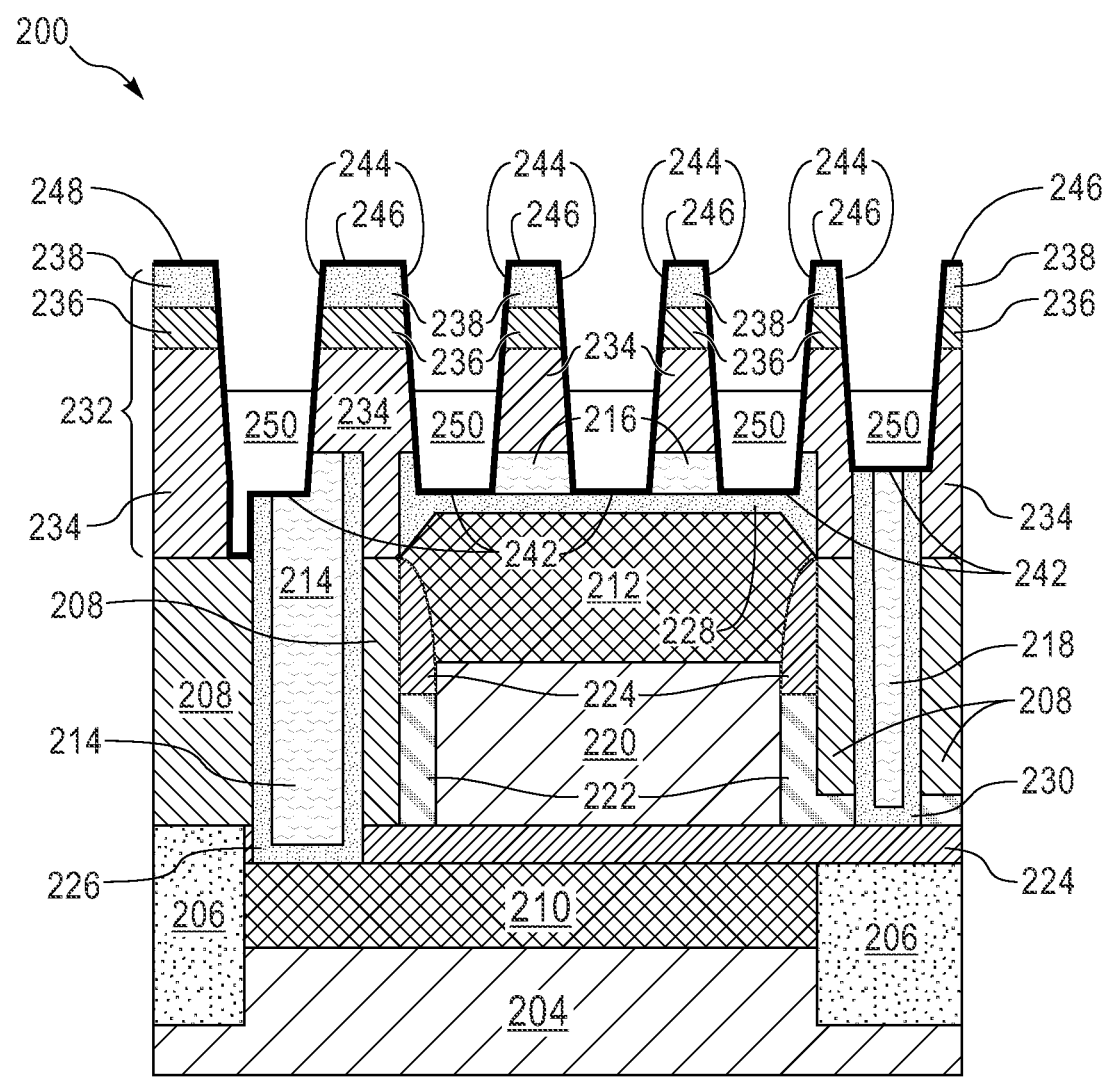
FIG. 7 is a schematic cross-sectional side view depicting a method at a spin-on carbon recess fabrication stage, in accordance with one embodiment of the present invention.

FIG. 7 is a schematic cross-sectional side view depicting the VTFET device 200 at a fabrication stage, in accordance with one embodiment of the present invention. The carbon layer 250 is recessed below the top horizontal portion 246 (block 112). The carbon layer 250 may be recessed using known techniques such as reactive ion etching. The processes may employ plasma (e.g., $N_2H_2$), laser stripping, or other energetic stripping or ashing techniques. The carbon layer 250, as recessed, protects the bottom horizontal portion 242 of the thin nitride layer 248 and, to a less-important degree, the vertical portions 244 of the thin nitride layer 248 during a directed etch process for removing the thin nitride layer 248 from the top horizontal portion 246.

Figure 8:
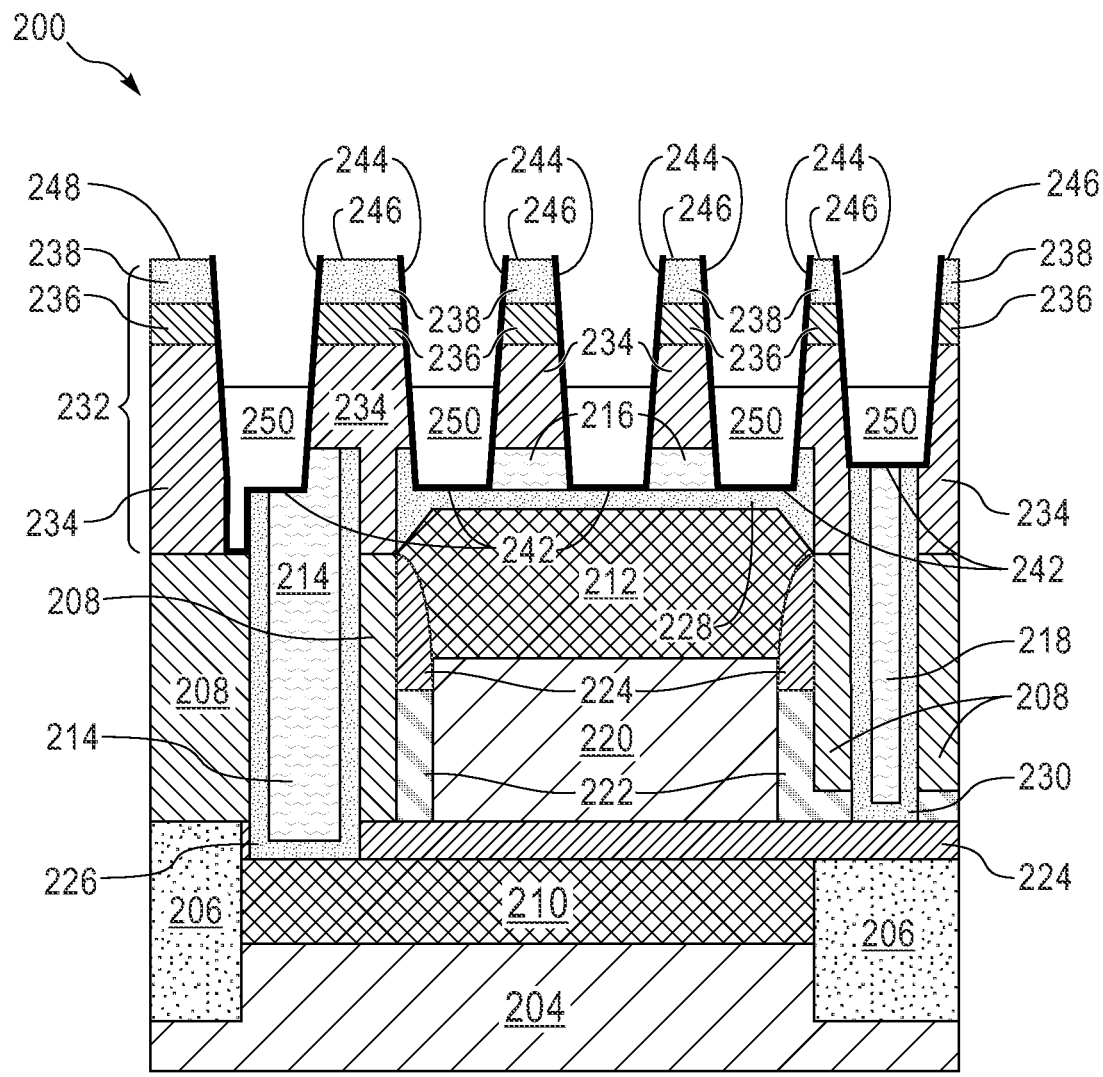
FIG. 8 is a schematic cross-sectional side view depicting a method at a sacrificial nitride etch back fabrication stage, in accordance with one embodiment of the present invention.

FIG. 8 is a schematic cross-sectional side view depicting the VTFET device 200 at a fabrication stage, in accordance with one embodiment of the present invention. The thin nitride layer 248 has been etched from the top horizontal portion 246, exposing the hard mask layer 238 underneath (block 114). The etch process for removing the thin nitride layer 248 from the top horizontal portion 246 may include anisotropic etching to preferentially remove the top horizontal portion 246 by etching vertically. The bottom horizontal portion 242 is protected by the carbon layer 250, and the vertical portions 244 are affected significantly less by the anisotropic etch.

Figure 9:
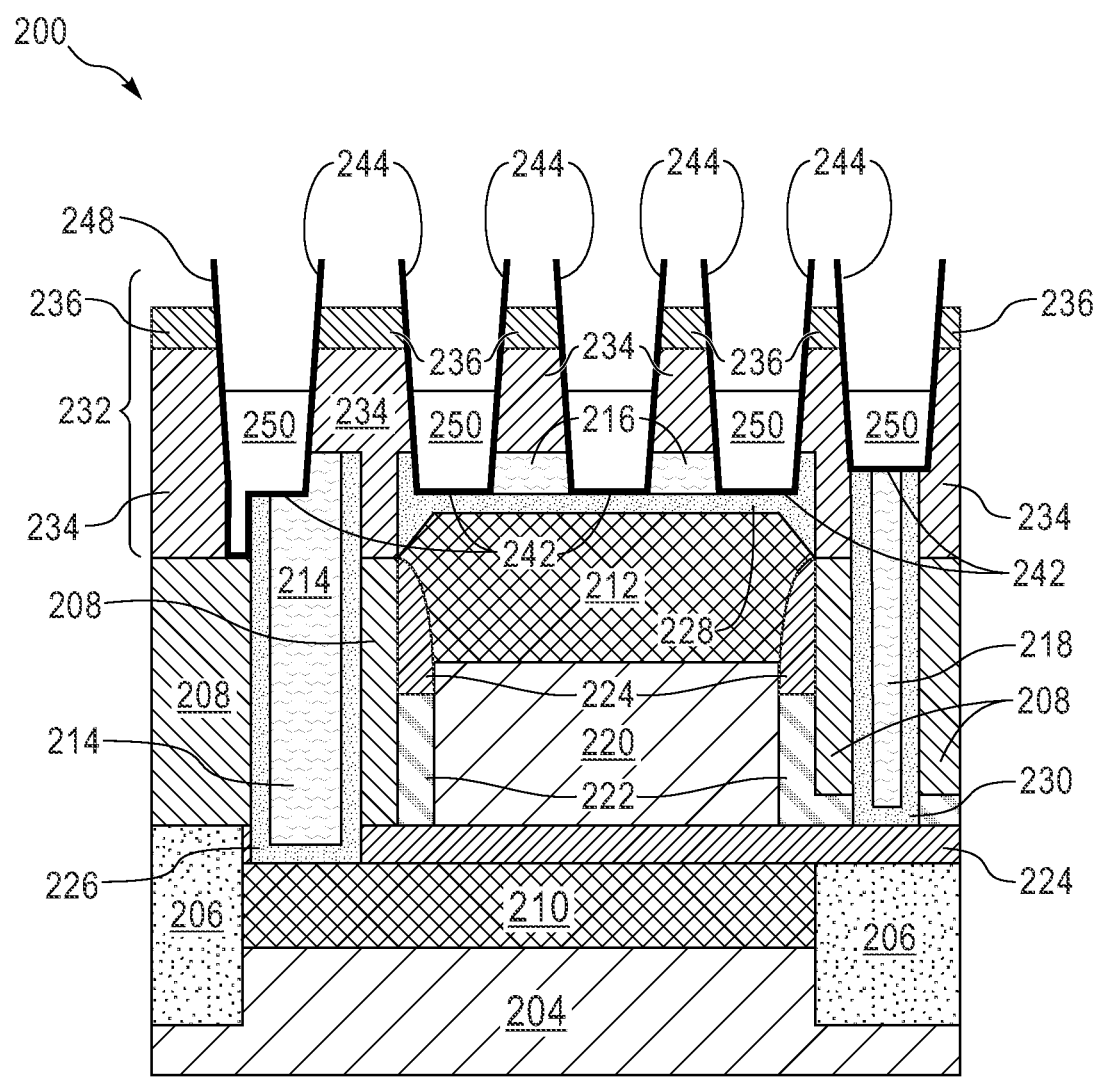
FIG. 9 is a schematic cross-sectional side view depicting a method at a hard mask removal fabrication stage, in accordance with one embodiment of the present invention.

FIG. 9 is a schematic cross-sectional side view depicting the VTFET device 200 at a mask removal stage, in accordance with one embodiment of the present invention. The hard mask layer 238 is removed using known techniques such as wet etch removal (block 116). The etch process is completed without affecting the sacrificial nitride layer 236, the thin nitride layer 248, or the carbon layer 250, which are the only materials with exposed surfaces. In particular, the hard mask layer 238 is removed while the thin nitride layer 248 covers and protects the low-k dielectric layer 234.

Figure 10:
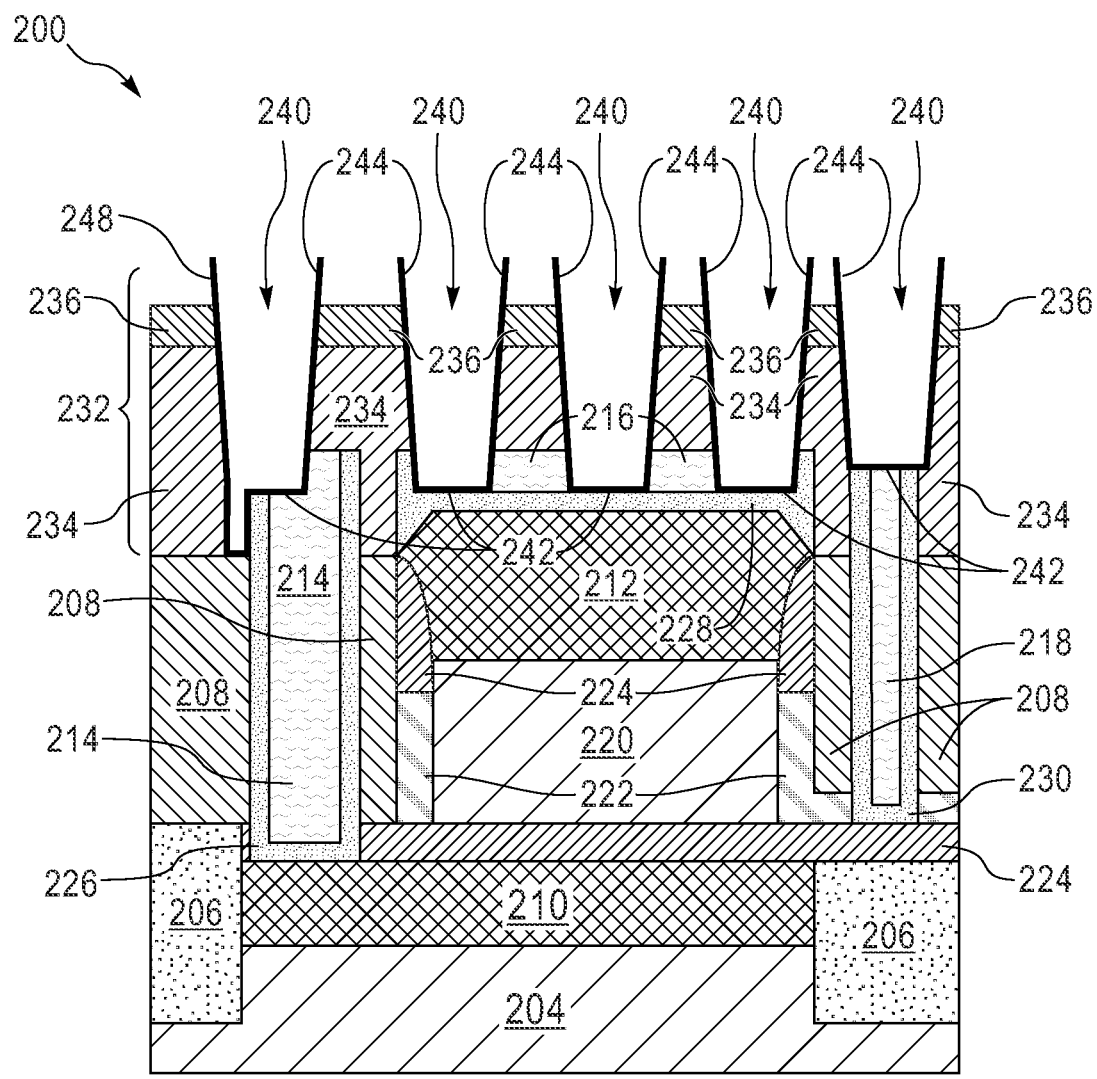
FIG. 10 is a schematic cross-sectional side view depicting a method at a spin-on carbon ashing stage, in accordance with one embodiment of the present invention.

FIG. 10 is a schematic cross-sectional side view depicting the VTFET device 200 at a fabrication stage, in accordance with one embodiment of the present invention. The carbon layer 250 is removed from the VTFET device 200 (block 118). The carbon layer 250 may be removed using similar processes and techniques to the recess step described above. The removal of the carbon layer 250 may be done after removal of the hard mask layer 238 (as shown in the illustrated process between FIGS. 9 and 10), and in certain embodiments the carbon layer 250 may be removed before removal of the hard mask layer 238. In both of these steps, the thin nitride layer 248 protects the low-k dielectric layer 234, the top S/D contact 216, and the cap liner 228. In particular, the low-k dielectric layer 234 can be significantly deteriorated during ashing of the carbon layer 250, so the thin nitride layer 248 is very beneficial during the ashing step.

Figure 11:
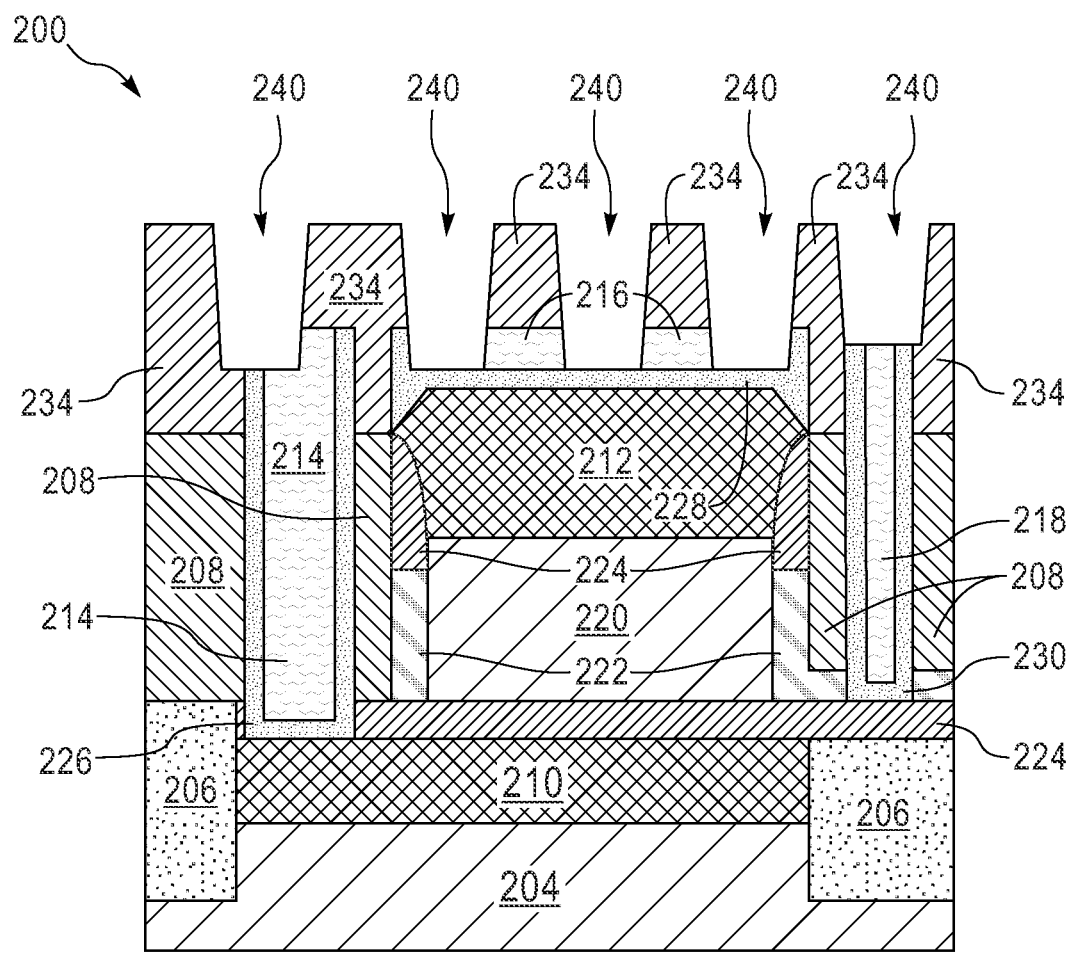
FIG. 11 is a schematic cross-sectional side view depicting a method at a sacrificial nitride removal stage, in accordance with one embodiment of the present invention.

FIG. 11 is a schematic cross-sectional side view depicting the VTFET device 200 at a fabrication stage, in accordance with one embodiment of the present invention. The silicon nitride is removed from the VTFET device 200 (block 120). Specifically, the thin nitride layer 248 and the sacrificial nitride layer 236 are both removed. The removal of the thin nitride layer 248 and the sacrificial nitride layer 236 may be done using a wet etch process such that all the silicon nitride is removed without affecting the exposed surfaces of the low-k dielectric layer 234, gate contact 218, the gate contact liner 230, the bottom S/D contact 214, the bottom contact liner 226, the top S/D contact 216, or the cap liner 228.

Figure 12:
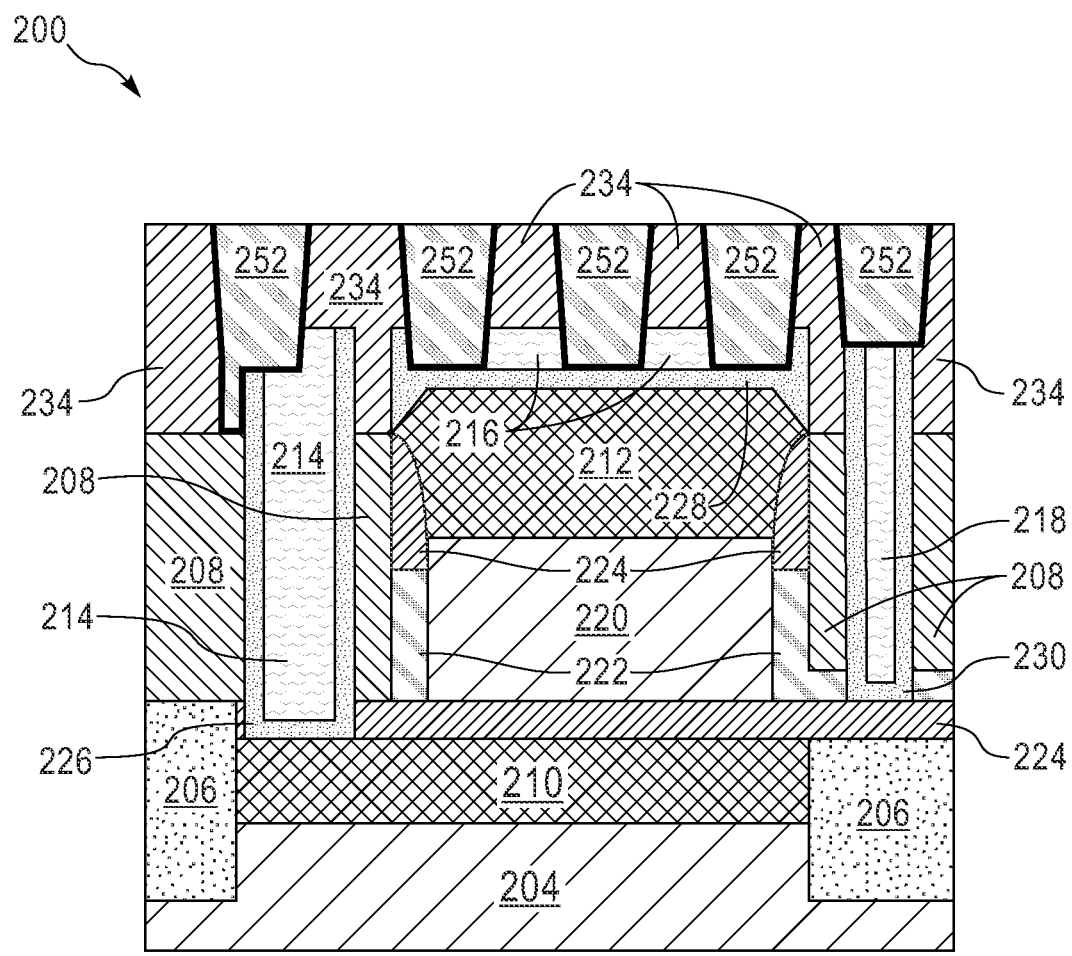
FIG. 12 is a schematic cross-sectional side view depicting a method at a metallization fabrication stage, in accordance with one embodiment of the present invention.

FIG. 12 is a schematic cross-sectional side view depicting the VTFET device 200 at a fabrication stage, in accordance with one embodiment of the present invention. The VTFET device 200 is metallized with vias 252 that connect the contacts 214, 216, 218 to a second MOL layer (block 122). The metallized vias 252 and trenches may include a conductive material such as metal. In particular, the metallized vias 252 and trenches may be formed of a metal such as, for example, tungsten, tantalum, hafnium, zirconium, niobium, titanium, titanium nitride, copper, or alloys comprising carbon. After the contact metal used to form the vias 252 is deposited, chemical-mechanical planarization (CMP) may be used to remove excess contact material stopping at the top of the low-k dielectric layer 234 such that the top surface of trenches 252 is coplanar with the top horizontal portion 246 of the low-k dielectric layer 234.

The integrated circuit chips resulting from the processes described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   etching vias and trenches in a middle-of-line (MOL) layer comprising a low-k dielectric layer, a sacrificial nitride layer, and a hard mask layer;
   depositing a thin nitride layer within the vias and trenches;
   depositing a carbon layer on the thin nitride layer within the vias and trenches;
   etching back a top horizontal portion of the thin nitride layer to expose a portion of the hard mask layer, wherein the carbon layer protects a bottom horizontal portion of the thin nitride layer;
   removing the hard mask layer while the carbon layer and the thin nitride layer protect the low-k dielectric layer and a top source/drain contact, wherein the thin nitride layer forms vertical portions above the sacrificial nitride layer;
   removing the carbon layer; and
   removing the thin nitride layer and the sacrificial nitride layer.

2. The method of claim 1, wherein depositing the thin nitride layer comprises atomic layer deposition.

3. The method of claim 1, wherein the thin nitride layer contacts a source/drain contact material.

4. The method of claim 1, wherein depositing the carbon layer comprises:
   filling the trench to a level above the MOL layer;
   planarizing the carbon layer; and
   recessing the carbon layer to expose the thin nitride layer.

5. The method of claim 1, further comprising metallizing the via trench.

6. The method of claim 1, wherein removing the thin nitride layer and the sacrificial nitride layer comprises a wet etch step.

7. The method of claim 1, wherein the carbon layer protects a bottom horizontal portion of the thin nitride layer during the etching back of the thin nitride layer.

8. A method for removing a hard mask from a semiconductor device, comprising:
   etching vias and trenches in a middle-of-line (MOL) layer, wherein the vias and trenches comprise a bottom horizontal portion, vertical portions, and a top horizontal portion;
   depositing a thin nitride layer on the bottom horizontal portion, the vertical portions and the top horizontal portion;
   depositing a carbon layer on the first horizontal portion;
   etching back the thin nitride layer on the top horizontal portion to expose a hard mask layer, wherein the carbon layer protects a bottom horizontal portion of the thin nitride layer;
   removing the hard mask layer to expose a sacrificial nitride layer while the carbon layer and the thin nitride layer protect the low-k dielectric layer and a top source/drain contact, wherein the thin nitride layer forms vertical portions above the sacrificial nitride layer;
   removing the carbon layer; and
   removing the thin nitride layer and the sacrificial nitride layer.

9. The method of claim 8, wherein depositing the thin nitride layer comprises atomic layer deposition.

10. The method of claim 8, wherein the bottom horizontal portion of the thin nitride layer contacts a source/drain contact material.

11. The method of claim 8, wherein depositing the carbon layer comprises:
   filling the trench to a level above the top horizontal portion;
   planarizing the carbon layer; and
   recessing the carbon layer to expose the top horizontal portion.

12. The method of claim 8, further comprising metallizing the via trench.

13. The method of claim 8, wherein removing the thin nitride layer and the sacrificial nitride layer comprises a wet etch step.

14. The method of claim 8, wherein etching the via trench comprises etching through a source/drain contact to expose a cap liner located between the source/drain contact and a source/drain, and wherein the bottom horizontal portion of the thin nitride layer contacts the cap liner.

15. A method, comprising:
   depositing a thin nitride layer within vias and trenches of a middle-of-line (MOL) layer;
   depositing a carbon layer on the thin nitride layer within the vias and trenches;
   etching back a top horizontal portion of the thin nitride layer to expose a hard mask layer, wherein the carbon layer protects a bottom horizontal portion of the thin nitride layer;
   removing the hard mask layer while the carbon layer and the thin nitride layer protect the low-k dielectric layer and a top source/drain contact, wherein the thin nitride layer forms vertical portions above a sacrificial nitride layer;
   removing the carbon layer; and
   removing the thin nitride layer and the sacrificial nitride layer.

16. The method of claim 15, wherein depositing the thin nitride layer comprises atomic layer deposition.

17. The method of claim 15, wherein a bottom horizontal portion of the thin nitride layer contacts a source/drain contact material.

18. The method of claim 15, wherein depositing the carbon layer comprises:
   filling the trench to a level above the top horizontal portion;
   planarizing the carbon layer; and
   recessing the carbon layer to expose the top horizontal portion.

19. The method of claim 15, wherein removing the thin nitride layer and the sacrificial nitride layer comprises a wet etch step.

20. The method of claim 15, wherein etching the vias and trenches comprises etching through a source/drain contact to expose a cap liner located between the source/drain contact and a source/drain, and wherein the bottom horizontal portion of the thin nitride layer contacts the cap liner.

* * * * *